United States Patent

Moore et al.

[11] Patent Number: 5,160,409
[45] Date of Patent: Nov. 3, 1992

[54] SOLDER PLATE REFLOW METHOD FOR FORMING A SOLDER BUMP ON A CIRCUIT TRACE INTERSECTION

[75] Inventors: Kevin D. Moore, Schaumburg; John W. Stafford, St. Charles; William M. Beckenbaugh, Barrington; Ken Cholewczynski, Streamwood, all of Ill.

[73] Assignee: Motorola, Inc., Schaumburg, Ill.

[21] Appl. No.: 740,271

[22] Filed: Aug. 5, 1991

[51] Int. Cl.⁵ .............................. B44C 1/22; C23F 1/00
[52] U.S. Cl. ............................... 156/656; 156/659.1; 156/666; 156/901; 228/180.1; 257/737; 29/827
[58] Field of Search ............... 156/634, 656, 659.1, 156/666, 901, 902; 357/67; 228/180.1, 180.2; 29/827, 831; 437/183, 209

[56] References Cited

U.S. PATENT DOCUMENTS

| | | | |
|---|---|---|---|
| 3,871,014 | 3/1975 | King et al. | 357/67 |
| 3,871,015 | 3/1975 | Lin et al. | 357/67 |
| 4,545,610 | 10/1985 | Lakritz et al. | 357/65 X |
| 4,878,611 | 11/1989 | Lovasco et al. | 228/180.2 |

OTHER PUBLICATIONS

*Metal Finishing, Guidebook and kDirectory* published by Metals and Plastics Publication, Inc., (1987), pp. 280, 282, 284.

*Primary Examiner*—William A. Powell
*Attorney, Agent, or Firm*—Douglas D. Fekete

[57] ABSTRACT

A method for forming a solder-bumped circuit trace on a planar dielectric substrate includes fabricating a trace having an intersection between linear section, depositing onto the trace a uniform thin plate of solder alloy and reflowing the solder alloy to form a bump at the intersection. More particularly, the trace comprises first and second linear sections that intersect at an angle between 45 degrees and 135 degrees and have widths preferably between 50 and 150 microns. The solder plate is deposited, preferably by electroplating, at a thickness between about 10 and 25 microns. Thereafter, when the trace is heated to melt the solder layer, the solder coalesces at the intersection to form the bump.

14 Claims, 1 Drawing Sheet

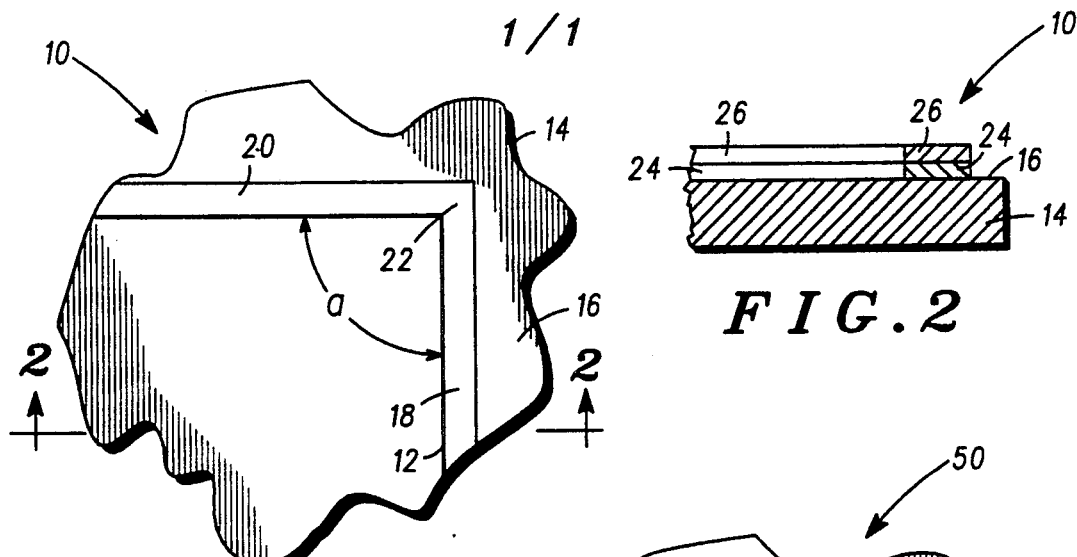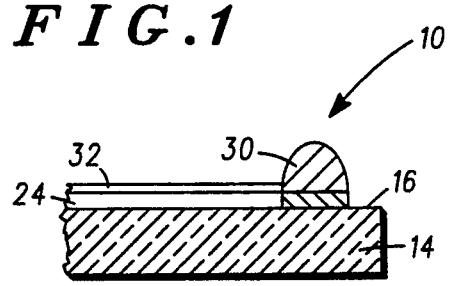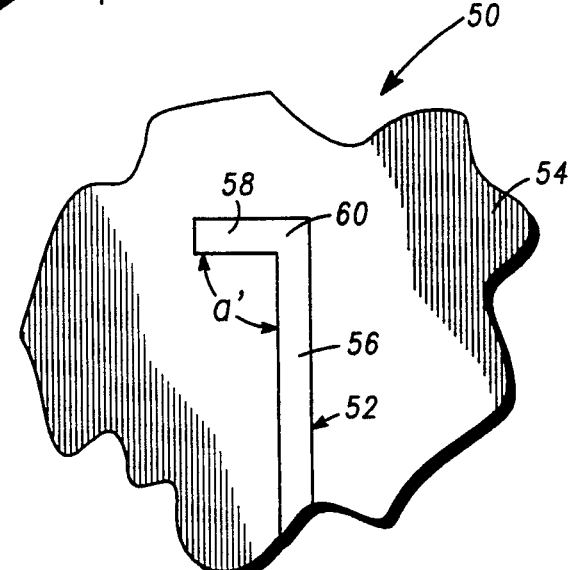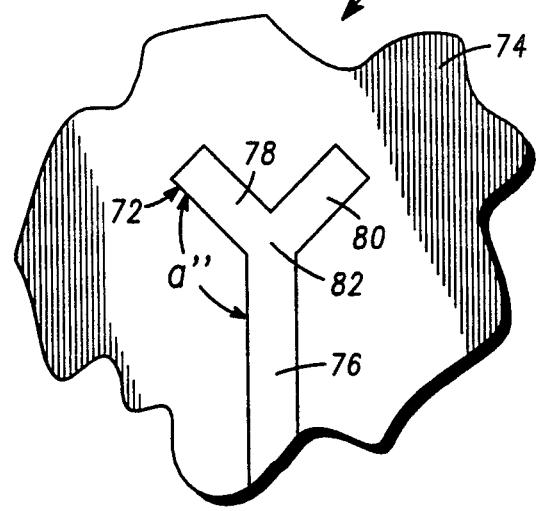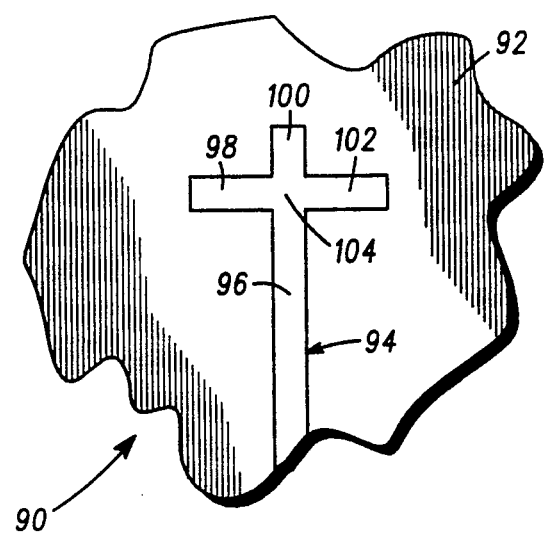
FIG.1  FIG.2  FIG.3  FIG.4  FIG.5  FIG.6

SOLDER PLATE REFLOW METHOD FOR FORMING A SOLDER BUMP ON A CIRCUIT TRACE INTERSECTION

BACKGROUND OF THE INVENTION

This invention relates to a method for forming a solder-bumped circuit trace on a printed circuit board or the like. More particularly, this invention relates to such method comprising reflow of a thin solder plate deposited on a circuit trace to cause the solder to coalesce onto an intersection between linear sections of the trace and form a solder bump.

In the manufacture of a microelectronic package, it is know to utilize a solder bump preformed on a circuit trace of a printed circuit board to attach an electronic component. For example, such solder bumps are employed to form solder bump interconnections for attaching an integrated circuit die mounted on a chip carrier to the board. For this purpose, the board includes a copper circuit trace disposed on a dielectric substrate. To mount the component, a solder bump is attached to a bond pad on the component, typically by placing a preformed microsphere of the solder alloy on the pad and heating to reflow the solder. The bumped component is assembled with the board such that the bump rests against the trace at a predetermined site. The assembly is heated to reflow the solder so that, upon cooling to resolidify the solder, the solder is bonded to the trace as well as the component pad to physically join the component to the board and also to electrically connect the component to the trace for conducting electrical signals to and from the component for processing.

In the formation of such solder bump interconnections, it is found to be advantageous to apply a solder bump to the trace at the attachment site. The solder bump may be formed on the circuit board by applying and reflowing the preformed microsphere in a manner similar to the component. However, in forming bumps on the printed circuit board, it is convenient to apply the solder by electroplating. It is known to electroplate solder onto a circuit trace to facilitate bonding of surface mounted components. However, such practices utilize a generally uniform plate that does not provide a sufficient mass for a solder bump interconnection. Thus, there remains a need for preforming a solder bump on a circuit trace at a designated site and having a mass sufficient for forming a solder bump interconnection.

SUMMARY OF THE INVENTION

This invention contemplates a method for forming a solder-bumped circuit trace on a planar dielectric substrate that includes fabricating a trace having an intersection between linear sections, depositing onto the trace a thin plate of solder alloy and reflowing the solder alloy to form a bump. For this purpose, the trace comprises a first linear section and a second linear section that is disposed to intersect the first section at an intersection such that the angle between the sections is between 45 degrees and 135 degrees. The first trace section has a generally uniform width, typically less than 500 microns and preferably between 50 and 150 microns. The second trace section has a generally uniform width, which may be either equal to of different from the first section width, that also is typically less than 500 microns and preferably between 50 and 150 microns. The trace is formed of a solder-wettable metal, most commonly copper. Prior to reflow, the trace includes a thin, outer plate composed of the solder alloy and having a uniform thickness. Preferably, the solder plate is deposited by electroplating to a thickness between about 10 and 25 microns. Thereafter, when the trace is heated to melt the solder layer, it is surprisingly found that the solder alloy coalesces at the intersection to from the desired bump.

In one aspect of this invention, a method is provided for manufacturing a printed circuit board that includes the solder-bumped trace. The method includes applying a copper plate onto a dielectric substrate and thereafter applying a photolithographic mask or the like onto the plate. The mask defines an opening that exposes the copper at the trace, but covers the copper plate on the region adjacent to the trace. The masked copper plate is immersed in an electroplating bath containing dissolved tin and lead ions and cathodically biased to codeposit tin and lead metal onto the exposed copper to form a thin solder plate. Thereafter, the mask is removed, and the plate is immersed in a copper etching solution. The solder coating protects the underlying trace copper, while the solution etches the exposed copper to define the trace. The trace is then heated to reflow the solder to form the bump.

Thus, this invention provides a convenient method for forming a solder bump on a circuit trace. The bump is formed from a thin solder plate, thereby reducing the plating time. The solder plate also advantageously serves as an etch mask prior to reflow, allowing the circuit trace to be defined and the solder deposited using but a single photolithographic mask. Even though the solder is deposited as a thin plate, when the trace is subsequently heated to melt the solder alloy, the solder nevertheless coalesces to form a bump of a sufficient mass for use, for example, in attaching a component by solder bump interconnection.

DESCRIPTION OF THE DRAWINGS

The present invention will be further illustrated with reference to the accompanying drawings wherein:

FIG. 1 is a partial plan view of a printed circuit board showing a circuit trace adapted for forming a solder bump in in accordance with this invention;

FIG. 2 is a cross-sectional view of the printed circuit board in FIG. 1, taken along line 2—2, showing a solder-plated trace prior to reflow;

FIG. 3 is a cross-sectional view of the circuit trace in FIG. 2 following reflow of the solder plate to form a bump;

FIG. 4 is a partial plan view of a printed circuit board showing an alternate embodiment of a circuit trace for forming a solder bump in accordance with this invention;

FIG. 5 is a partial plan view of a printed circuit board showing still another embodiment of a circuit trace for forming a solder bump in accordance with this invention; and FIG. 6 is a partial plan view of a printed circuit board showing still another embodiment of a circuit trace for forming a solder bump in accordance with this invention.

DETAILED DESCRIPTION OF THE INVENTION

In a preferred embodiment, referring to FIGS. 1-3, the method of this invention is employed to form a printed circuit board 10 having a solder-bump circuit trace 12. Printed circuit board 10 comprises a dielectric substrate 14 of the type referred to as an FR4 card and composed of an epoxy resin and glass fiber laminate. Substrate 14 has a planar major surface 16 to which is affixed circuit trace 12. For purposes of illustrating the features of this invention, board 10 is only partially depicted in the figures, it being understood that the depicted region constitutes but a minor proportion of the total area and that circuit trace 12 extends onto other regions of the board for conducting electrical signals for processing. In accordance with this invention, circuit trace 12 comprises a first linear section 18 and a second linear section 20, each having generally uniform width of about 100 microns. Sections 18 and 20 are arranged on surface 16 to intersect at an intersection designated generally at 22 and such that the angle a between the sections is a right angle, i.e., 90 degrees.

Referring to FIG. 2, in accordance with the method of this invention, circuit trace 12 is initially formed of two coextensive metal layers 24 and 26. Layer 24 lies immediately adjacent substrate surface 16 and is formed of metallic copper having high electrical conductivity conducive to conducting electrical signals. Copper layer 24 is coated by a thin layer 26 composed of electroplated tin-lead solder alloy.

Printed circuit board 10 is manufactured by patterning a copper plate to define trace 12, including intersecting sections 18 and 20, and electroplating solder onto the trace. Accordingly, a copper plate is initially applied to dielectric substrate 14 to completely cover surface 16. Thus, the plate includes a region for forming layer 24 of trace 12 and an adjacent region about trace 12. A suitable copper-plated board is readily commercially available and features a copper plate having thickness of about 17 microns. A film of photoimagable polymer material is applied to the copper plate and selectively irradiated to develop the polymer to form a photoresist mask. The mask is about 25 microns thick and covers the copper plate region about the trace and defines an opening whereat the trace layer 24 is exposed.

The masked board is immersed in a tin-lead plating solution and cathodically biased to deposit solder alloy onto the exposed copper trace. A suitable plating bath comprises, in water, 56.3 grams per liter tin, added as concentrated stannous fluoborate solution; 26.3 grams per liter lead, added as concentrated lead fluoborate solution, 99.8 grams per liter fluoboric acid; 26.3 grams per liter boric acid and 19.5 grams per liter liquid peptone. The masked board is immersed in the bath at ambient temperature spaced apart from a tin-lead counterelectrode. An electrical potential is applied to the copper plate to negatively bias the copper relative to the counterelectrode and codeposit metallic tin and metallic lead onto the exposed copper surface. One advantage of plating the tin-lead deposit onto the copper plate prior to removing the unwanted copper about the trace is that the continuous plate facilitates distribution of the plating current to produce a uniform electrodeposit. The resulting plate is composed of about 40 percent lead and the balance tin and has a thickness of about 20 microns. The plate thickness is preferably less than the thickness of the mask, so that plating is confined to the opening above the trace and does not extend upon the mask surface.

Following plating, the board is immersed in an alkaline solution to strip the photoresist mask, thereby exposing the copper plate region about the solder-coated trace. The board is immersed in an aqueous copper-etching solution containing ammonium persulfate, followed by a water rinse. The etching solution removes the exposed copper. However, the tin-lead alloy is resistant to attack by the etching solution and acts as a mask to protect the underlying copper trace. In this manner, the unwanted copper is removed from about the trace to complete fabrication of the solder-plated trace depicted in FIG. 2 and featuring the copper plate 24 coated with the uniform, thin solder plate 26.

The printed circuit board having the dual-layer trace 12 is heated to reflow the solder to form the desired bump on intersection 22. A flux composed of amine hydrochloride and amine hydrobromide in isopropyl alcohol vehicle is applied to the solder plate surface. The board is immersed in hot polyoxyalkylene glycol bath at 250° C. for 15 seconds. It was found that during immersion, the solder alloy melted and reflowed to draw solder from the sections onto intersection 22, thereby forming a bump 30 shown in FIG. 3. Following reflow, a residual solder film 32 remains on sections 18 and 20, but the thickness is significantly reduced compared to the initial film. Bump 30 has a height greater than 40 microns and preferably between 60 and 80 microns. Thus, bump 30 is particularly well suited for use in forming a solder bump interconnection to attach an electrical component to printed circuit board 10.

In the embodiment depicted in FIG. 1, sections 18 and 20 extend an indefinite length from intersection 22. This arrangement is particularly advantageous for allowing electrical signals to be conducted from a component attached to intersection 22, using bump 30, to or from distinct portions of the electrical circuit. However, the method of this invention is not limited to traces wherein both linear sections are active leads for the electrical circuit, but may be employed to produce a solder bump at an intersection wherein only one section is connected to the circuit.

Referring to FIG. 4, a printed circuit board 50 comprises a circuit trace 52 having an alternate configuration suitable for forming a solder bump thereon in accordance with the method of this invention. Trace 52 is disposed on a planar dielectric substrate 54 similar to substrate 14 in FIG. 1. Trace 52 comprises a first linear section 56 and a second linear section 58 that intersect at a right angle a' to form an intersection indicated generally at 60. In this embodiment, linear section 56 extends beyond the region depicted in FIG. 4 for connection to remote electrical features on board 50 to provide an active lead for conveying electrical signals to and from intersection 60. However, second section 58 is shortened and, except through the connection through lead 56, is not otherwise connected to the electrical circuit. As depicted in FIG. 4, trace 52 comprises a copper layer immediately overlying substrate 54 and a thin, uniform tin-lead solder electroplate. That is, trace 52 is shown following patterning of the copper layer and electrodeposition of the thin solder plate in a condition similar to FIG. 2, but prior to reflow of the solder alloy. Thereafter, trace 52 is heated, for example, by immersion in a hot oil bath, to melt the outer solder plate, whereupon the molten solder is drawn onto intersection 60 from the adjacent sections to form a solder bump.

The size of the bump formed during reflow is believed to be principally determined by the surface tension of the molten alloy and is independent of the length of the adjacent sections, provided that sufficient molten alloy is available for forming the bump. Thus, for linear sections of comparable widths, the size of the bump formed at intersection 60 of trace 52 in FIG. 4 is believed to be equal to the bump formed at intersection 22 of trace 12 in FIG. 1, with additional molten metal being drawn as needed from section 56 to compensate for any deficiency in the volume of metal drawn from section 58.

Thus, this invention provides a method for forming a solder bump on a circuit trace by reflowing a thin solder plate deposited onto the trace metal. The surprising formation of the solder bump is found to occur at an intersection between two linear trace sections. Thus, in general, the method of this invention is applicable to a trace configuration that includes a first and a second section that connect at an intersection. The method is particularly suitable for use with runners having widths less than 500 microns, such as is commonly employed in designing circuit traces. The preferred section widths is between about 50 and 150 microns. In the embodiment shown in FIG. 1, and again in the embodiment shown in FIG. 4, sections having equal widths were utilized in forming the bumps. However, sections having different widths may be employed, for example, as necessary to accommodate other design considerations for the electrical circuit. It is believed that optimum conditions for bump formation during reflow are provided by sections arranged so that the angle therebetween is a right angle. However, conditions for forming a suitable bump exist where the angle between the sections is between about 45 degrees and 135 degrees.

Referring to FIG. 5, in still another embodiment of this invention, a printed circuit board 70 includes a Y-shaped trace 72 suitable for forming a bumped intersection in accordance with this invention. Trace 72 is affixed to a dielectric substrate 74 and includes a first section 76 that extends for a remote connection to other electrical features on board 70 so as to act as an active lead for the electrical circuit. Trace 72 further comprises shortened sections 78 and 80 that intersect trace section 76 at an intersection 82. Sections 76, 78 and 80 are disposed equiangularly about intersection 82 such that each angle a" between adjacent sections is 120 degrees. Trace 72 is shown prior to reflow and comprises an underlying copper layer immediately adjacent substrate 74 and a uniform, thin electroplate of tin-lead solder alloy, similar to trace 12 in FIG. 2. Thereafter, the trace is heated to melt the outer solder plate, whereupon the solder coalesces at intersection 82 to form a solder bump. In this embodiment, the two shortened sections 78 and 80 increase the volume of solder adjacent intersection 82 to be drawn by capillary action for forming the bump.

FIG. 6 shows yet another embodiment of a trace configuration suitable for forming a solder bump in accordance with this invention. A printed circuit board 90 comprises a dielectric substrate 92 having affixed thereto a trace 94. Trace 94 comprises a first linear section 96 that extends for connection to remote features of the electrical circuit to serve as an active lead. In addition, trace 94 includes three shortened linear sections 98, 100 and 102 that intersect section 96 and each other at an intersection designated generally at 104. The sections 96, 98, 100, and 102 are disposed equiangularly about intersection 104 so as to provide right angles between adjacent sections. The trace 94 is depicted in the initial plated condition prior to reflow and comprises an underlying copper layer immediately adjacent substrate 92 and an outer solder electroplate of uniform thickness overlying each section. Thereafter, trace 94 is heated, for example, by immersion in an oil bath, to reflow the solder plate, whereupon the solder is drawn by capillary forces from sections 96, 98, 100, and 102 to coalesce at intersection 104 to form a solder bump. The embodiment in FIG. 6 is particularly advantageous for providing the preferred right angle arrangement between adjacent sections while increasing the volume of solder adjacent the intersection 104.

A significant feature of this invention is the formation of the bump during reflow from an initial thin plate of solder alloy on the trace. While copper is most commonly selected for the trace metal because of its relative low cost and advantageous electrical properties including a low resistance conducive for conducting electrical signals, the terminal may be formed of any suitable metal that provides a solder-wettable surface, including, for example, nickle or gold, either applied directly onto the dielectric substrate or onto a copper or other metal base to provide an intermediate layer between the base and the solder. The solder layer may be formed of any suitable solder alloy. Typical solder alloys are formed predominantly of one or more metals selected from the group consisting of lead, tin and indium and include lead-base alloys containing about 5 weight percent tin and indium-base alloys containing about 30 percent lead. Preferably, the solder is composed of near-eutectic tin-lead alloy containing between about 35 and 45 percent lead. Although the solder is preferably deposited by electroplating, the plate may be formed by sputtering or any process suitable for applying a thin layer of the solder metal onto the trace.

In the described embodiment depicted in FIGS. 1–3, reflow of the thin solder plate also left a residual film on the runner. It is desired to deposit a solder thickness adequate to provide sufficient molten alloy to maximize the bump size. Depending upon the intended application, the residual film on the runner may be advantageous, for example, to provide a protective coating. On the other hand, for a specific trace configuration, it may be desirable to minimize the initial solder deposit to reduce or eliminate the residual film. A solder plate having a thickness less than 25 microns provides sufficient metal during reflow for bump formation. Preferably, the initial solder plate thickness is between about 10 and 25 microns. For forming solder bump interconnections, it is desired to produce a bump having a height measured relative to the copper trace surface of at least 40 microns, and preferably between about 60 and 80 microns.

While this invention has been described in terms of certain embodiments thereof, it is not intended that it be limited to the above description but rather only to the extent set forth in the claims that follow. The embodiments of the invention in which an exclusive property or privilege is claimed are defined as follows.

We claim:

1. A method for forming a solder-bumped circuit trace on a dielectric substrate, said method comprising
    fabricating a circuit trace on the substrate comprising a first linear section and a second linear section disposed to intersect said first section at intersection so as to form an angle between the sections that is between about 45 degrees and 135 degrees, said trace comprising a solder-wettable metal layer adjacent the substrate and an outer plate composed of a solder alloy and having a uniform thickness, and heating the circuit trace at a temperature effective to melt the solder alloy and to draw the molten solder alloy onto the intersection to form a solder bump.

2. A method in accordance with claim 1 wherein the solder-wettable metal layer is formed of copper.

3. A method in accordance with claim 1 wherein the solder alloy is formed predominantly of metal selected from the group consisting of lead, tin and indium.

4. A method for forming a solder-bumped circuit trace on a dielectric substrate, said method comprising
fabricating a circuit trace on the substrate comprising a first linear section and a second linear section, said first section having a generally uniform width less than 500 microns, said second section having a generally uniform width less than 500 microns and being disposed to intersect said first section at an intersection so as to form an angle between the sections that is between about 45 degrees and 135 degrees, said trace comprising a copper layer adjacent the substrate and an outer plate composed of a tin-lead solder alloy and having a uniform thickness less than about 25 microns, and
heating the circuit trace at a temperature effective to melt the solder alloy and to draw the molten solder alloy onto the intersection to form a solder bump.

5. The method in accordance with claim 4 wherein the first section width is between about 50 and 150 microns.

6. The method in accordance with claim 4 wherein the second section width is between about 50 and 150 microns.

7. The method in accordance with claim 4 wherein the solder plate is an electrodeposited plate composed of an alloy comprising between about 35 and 45 weight percent lead and the balance substantially tin.

8. The method in accordance with claim 4 wherein the solder plate has a thickness between about 10 and 25 microns.

9. The method in accordance with claim 4 wherein the solder bump has a height greater than 40 microns.

10. A method for manufacturing a printed circuit board comprising a solder-bumped copper circuit trace, said trace comprising a first linear section and a second linear section disposed to intersect said first section at an intersection so as to form an angle between the sections that is between about 45 degrees and 135 degrees, said method comprising
applying a metallic copper plate having a uniform thickness onto a dielectric substrate, said plate including the trace and extending to a region adjacent the trace,
applying a removable mask onto the copper plate such that the mask covers the adjacent region and defines an opening whereat the trace is exposed,
immersing the masked copper plate into an electroplating bath containing dissolved tin and lead ions, and cathodically biasing the plate to codeposit metallic tin and metallic lead onto the exposed trace to form an outer plate of tin-lead solder alloy, whereby the mask prevents deposition onto the adjacent region,
removing the mask from the copper plate to expose the adjacent region,
etching the copper to remove the adjacent region, whereby the solder plate protects the underlying copper from etching to define the circuit trace, and
heating to reflow the solder alloy, whereupon molten solder alloy is drawn onto the intersection from the adjacent sections to form a solder bump.

11. The method in accordance with claim 10 wherein the first section width is between about 50 and 150 microns.

12. The method in accordance with claim 10 wherein the second section width is between about 50 and 150 microns.

13. The method in accordance with claim 10 wherein the solder plate is composed of an alloy comprising between about 35 and 45 weight percent lead and the balance substantially tin.

14. The method in accordance with claim 10 wherein the solder plate has a thickness between 10 and 25 microns and the solder bump has a height greater than about 40 microns.

* * * * *